United States Patent
Hinata et al.

(10) Patent No.: US 11,171,078 B2
(45) Date of Patent: Nov. 9, 2021

(54) SEMICONDUCTOR DEVICE AND METHOD FOR MANUFACTURING THE SAME

(71) Applicant: FUJI ELECTRIC CO., LTD., Kawasaki (JP)

(72) Inventors: Yuichiro Hinata, Matsumoto (JP); Tatsuo Nishizawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/801,996

(22) Filed: Feb. 26, 2020

(65) Prior Publication Data

US 2021/0020554 A1    Jan. 21, 2021

(30) Foreign Application Priority Data

Jul. 19, 2019   (JP) .............................. JP2019-133363

(51) Int. Cl.
| | |
|---|---|
| *H01L 23/49* | (2006.01) |
| *H01L 23/498* | (2006.01) |
| *H01L 25/18* | (2006.01) |
| *H01L 21/48* | (2006.01) |
| *H01L 25/07* | (2006.01) |
| H01L 23/31 | (2006.01) |

(52) U.S. Cl.
CPC .... *H01L 23/49811* (2013.01); *H01L 21/4853* (2013.01); *H01L 23/49833* (2013.01); *H01L 25/072* (2013.01); *H01L 25/18* (2013.01); H01L 23/3107 (2013.01)

(58) Field of Classification Search
CPC ......... H01L 23/49811; H01L 23/49833; H01L 25/18; H01L 21/4853; H01L 25/072;

(Continued)

(56) References Cited

U.S. PATENT DOCUMENTS

| | | | |
|---|---|---|---|
| 2008/0078572 A1* | 4/2008 | Watanabe ............ | H05K 3/4046 174/262 |
| 2009/0194884 A1 | 8/2009 | Stolze et al. | |
| 2012/0196493 A1* | 8/2012 | Murphy ............... | B23K 1/0016 439/842 |

(Continued)

FOREIGN PATENT DOCUMENTS

| | | |
|---|---|---|
| JP | 2004-349632 A | 12/2004 |
| JP | 2010-283107 A | 12/2010 |

(Continued)

OTHER PUBLICATIONS

JP 2004-349632 English Translation (Year: 2004).*
Mate 2014, Yokohama, "Development of Press-fit Terminal Structure for Power Modules", Feb. 4-5, 2014, pp. 83-86.

*Primary Examiner* — Steven T Sawyer

(57) ABSTRACT

A semiconductor device includes an insulated circuit board having conductor layers arranged away from each other and bonding materials each provided on the conductor layers; a wiring board having an opposing surface facing the conductor layers and through holes each corresponding to a position of each bonding material; hollow members each having a cylindrical portion and a flanged portion at one end of the cylindrical portion and having a cavity in common with the cylindrical portion, ok cylindrical portions press-fitted into the through holes, and other ends of the cylindrical portions bonded to the conductor layers by the bonding materials; and external connection terminals each inserted into the cavity of each hollow member and bonded to the conductor layers. Each cylindrical portion is inserted into each through hole such that each flanged portion contacts with an upper surface opposed to the opposing surface of the wiring board.

17 Claims, 7 Drawing Sheets

(58) Field of Classification Search
CPC ..... H01L 23/3107; H01L 23/12; H01L 24/01; H01L 23/48; H01L 24/29; H01L 24/48; H01L 2224/291; H01L 2224/45124; H01L 24/45; H01L 2224/73265; H01L 2224/48227; H01L 2224/32225; H01L 24/73; H01L 24/32; H01L 23/053; H01L 2224/04042; H01R 12/585; H01R 4/60; H01R 12/58; H05K 2201/10257; H05K 2201/1031; H05K 2201/10787; H05K 2201/10856; H05K 1/144; H05K 3/4015; H05K 1/18; H05K 2201/10295; Y02P 70/50

See application file for complete search history.

(56) References Cited

U.S. PATENT DOCUMENTS

| | | | |
|---|---|---|---|
| 2014/0246783 A1* | 9/2014 | Nishizawa | H01L 23/4334 257/774 |
| 2015/0380274 A1 | 12/2015 | Yoshimatsu et al. | |
| 2016/0233146 A1* | 8/2016 | Nakamura | H01L 25/18 |
| 2016/0322287 A1* | 11/2016 | Nishizawa | H01L 24/13 |
| 2016/0365307 A1* | 12/2016 | Miyakoshi | H01L 24/32 |
| 2018/0190554 A1 | 7/2018 | Adachi | |

FOREIGN PATENT DOCUMENTS

| | | |
|---|---|---|
| JP | 2014-157880 A | 8/2014 |
| JP | 2016-012604 A | 1/2016 |
| WO | 2017/159505 A1 | 9/2017 |

* cited by examiner

SEMICONDUCTOR DEVICE AND METHOD FOR MANUFACTURING THE SAME

CROSS-REFERENCE TO RELATED APPLICATIONS

This application claims benefit of priority under 35 USC 119 based on Japanese Patent Application No. 2019-133363 filed on Jul. 19, 2019, the entire contents of which are incorporated by reference herein.

TECHNICAL FIELD

The present invention relates to a semiconductor device and a method for manufacturing the same, and, more particularly, to a semiconductor device including a power semiconductor element and a method for manufacturing the same.

BACKGROUND ART

In semiconductor devices such as conventional power semiconductor modules, a semiconductor chip is bonded by solder or the like to an insulated circuit board arranged in a case, and is electrically connected to an external circuit via a terminal connected to a wiring layer of the insulated circuit board. There have been developed structures that connect a terminal such as a pin or a post through a hollow member arranged on a wiring layer. PTL 1 describes a structure in which each hollow member is bonded by solder onto a wiring layer arranged in a case to fix a terminal inserted into the each hollow member to each through hole of a wiring board arranged outside the case. PTL 2 describes a structure in which hollow members each having a flange at both ends thereof are bonded by solder to a wiring layer to fix terminals inserted into the hollow members to through holes of a wiring board arranged outside a case. Additionally, in PTL 3, a hollow contact member is bonded by solder onto an insulated circuit board arranged in a case. It is described in PTL 3 that a hollow member, which is an external electrode terminal fixed so as to enclose the hollow contact member, is bonded by solder onto an insulated circuit board. The hollow member is inserted into a through hole of a wiring board arranged outside the case.

For example, a positioning jig having an opening for installing the hollow member is mounted on the insulated circuit board, the hollow member is arranged in the opening, and then soldering is performed. To increase accuracy in mounting position for the hollow member, it is merely necessary to reduce tolerance of the opening of the jig. For example, if the tolerance is reduced to 100 μm or less, solder clogging occurs during melting of solder at the hollow member, which hinders removal of the jig. Additionally, although the occurrence of solder clogging increases as the amount of solder increases, solder thickness for bonding the hollow member needs to be made large to some extent in order to secure reliability of a solder bonded portion (see PTL 1). Accordingly, reducing the amount of solder to suppress solder clogging leads to difficulty in securing the reliability.

To secure the reliability and secure the assemblability, the positioning jig needs to be provided with a tolerance of about from 100 μm to 200 μm. Increasing the tolerance increases positional deviation in mounting the hollow member, which increases positional deviation in installing the terminal. If positional deviation occurs between the connection terminal and the hollow member, it is difficult to insert the connection terminal into the hollow member. Furthermore, NPL 1 describes regarding positional deviation of a terminal, in which particularly, in use of a contact energization means, such as a press-fit terminal, even a positional deviation of about 100 μm increases contact resistance by about 50%, causing contact failure and loss increase.

It is described in PTL 4 that when positioning a terminal, the terminal is retained by a jig, and bonded to a board by solder. Additionally, PTL 5 proposes that a terminal insertion side of a hollow member is fixed by a jig, and the other side thereof is soldered to an insulated circuit board. However, the jig is attached in such a manner as to cover an upper part of the hollow member. Due to that, particularly, in use of a flux containing solder paste, a release pathway for flux evaporated when heated is blocked, and the solder explosively scatters at a root side of the hollow member. As a result, the solder adheres to an inner surface of the hollow member, and hinders insertion of the terminal.

In addition, it is described in PTL 6 that a slit is formed in a hollow member serving as a connection terminal provided on a mounting component, and the hollow member is inserted into a through hole of a wiring board. An elastic fixing pin made of resin or the like is inserted into the hollow member, and the hollow member is fixed so as to be electrically connected to the through hole. However, PTL 6 does not describe regarding positional deviation that occurs when inserting the terminal into the hollow member provided on an insulated circuit board.

CITATION LIST

Patent Literature

PTL 1: JP 2010-283107 A
PTL 2: US Patent No. 2009/0194884
PTL 3: WO 2017/159505
PTL 4: JP 2014-157880 A
PTL 5: JP 2016-012604 A
PTL 6: JP 2004-349632 A

Non Patent Literature

NPL 1: Minoru Egusa et al., MATE 2014, Yokohama, "Development of Press-fit Terminal Structure for Power Modules", 2014, pp. 83-86.

SUMMARY OF INVENTION

Technical Problems

The present invention has been made in view of the above problems. It is an object of the invention to provide a semiconductor device capable of reducing deviation in a connection position of an external connection terminal and securing reliability and a method for manufacturing the semiconductor device.

Solution to Problems

To solve the above problems, one aspect of the present invention is a semiconductor device including: (a) an insulated circuit board including conductor layers arranged away from each other and a plurality of bonding materials each provided on the conductor layers; (b) a wiring board including an opposing surface facing the conductor layers and including a plurality of through holes each corresponding to a position of each of the plurality of bonding materials; (c)

a plurality of hollow members each including a cylindrical portion and a flanged portion provided at one end of the cylindrical portion and having a cavity in common with the cylindrical portion, the cylindrical portions each being press-fitted into each of the plurality of through holes, and other ends of the cylindrical portions being bonded to the conductor layers by the plurality of bonding materials; and (d) a plurality of external connection terminals each inserted into the cavity of each of the plurality of hollow members and bonded to the conductor layers, in which the cylindrical portions each are inserted into the each of the plurality of through holes such that the flanged portions each contact with an upper surface opposed to the opposing surface of the wiring board.

Another aspect of the present invention is a method for manufacturing a semiconductor device including: (a) preparing an insulated circuit board configured to include conductor layers arranged away from each other and a plurality of bonding materials each provided on the conductor layers; (b) preparing a wiring board on which a plurality of through holes are formed to correspond to positions where the plurality of bonding materials are arranged; (c) causing the wiring board to face the insulated circuit board such that an opposing surface of the wiring board is oriented toward the bonding materials; (d) preparing a plurality of hollow members each including a cylindrical portion and a flanged portion provided at one end of the cylindrical portion and having a cavity in common with the cylindrical portion, and press-fitting each of the cylindrical portions into each of the plurality of through holes such that the flanged portions each contact with an upper surface opposed to the opposing surface of the wiring board; (e) bonding each of other ends opposed to the one ends of the cylindrical portions passing through the plurality of through holes and protruding from the opposing surface to the conductor layers by the plurality of bonding materials; and (f) inserting an external connection terminal into the cavity of each of the plurality of hollow members.

Advantageous Effects of Invention

According to the present invention, there can be provided a semiconductor device capable of reducing deviation in connection positions of external connection terminals and securing reliability.

DESCRIPTION OF EMBODIMENTS

Hereinafter, embodiments of the present invention will be described. In the following description of the drawings, the same or similar portions are denoted by the same or similar reference signs. However, it should be noted that the drawings are schematic, and relationships between thickness and planar dimensions, ratios between thicknesses of respective devices and respective members, and the like are different from actual ones. Thus, specific thicknesses and dimensions should be determined in consideration of the following description. Moreover, it is obvious that there are some differences in mutual dimensional relationships and ratios between the drawings.

In the following description, the directions of "right and left" and "up and down" are merely defined for descriptive convenience, and do not limit the technological idea of the present invention. Thus, for example, when paper is rotated by 90 degrees, "upper and lower" and "up and down" are obviously read in exchange for one another. Thus, when rotated by 180 degrees, it is obvious that "left" and "right" are reversed.

Embodiment

Figure 1:
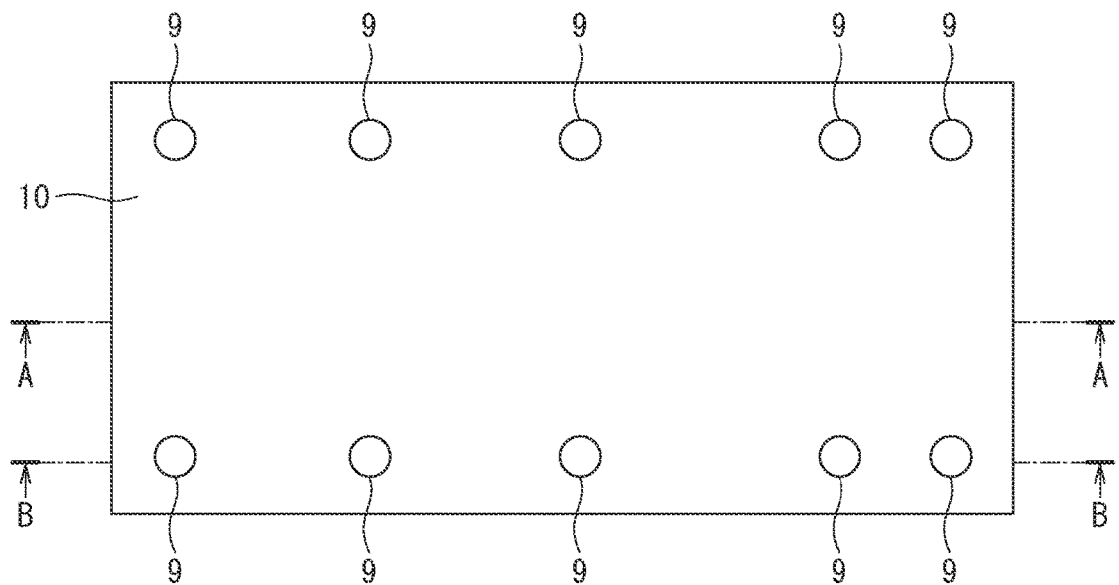
FIG. 1 is a top view illustrating one example of a semiconductor device according to an embodiment of the present invention.
Figure 3:
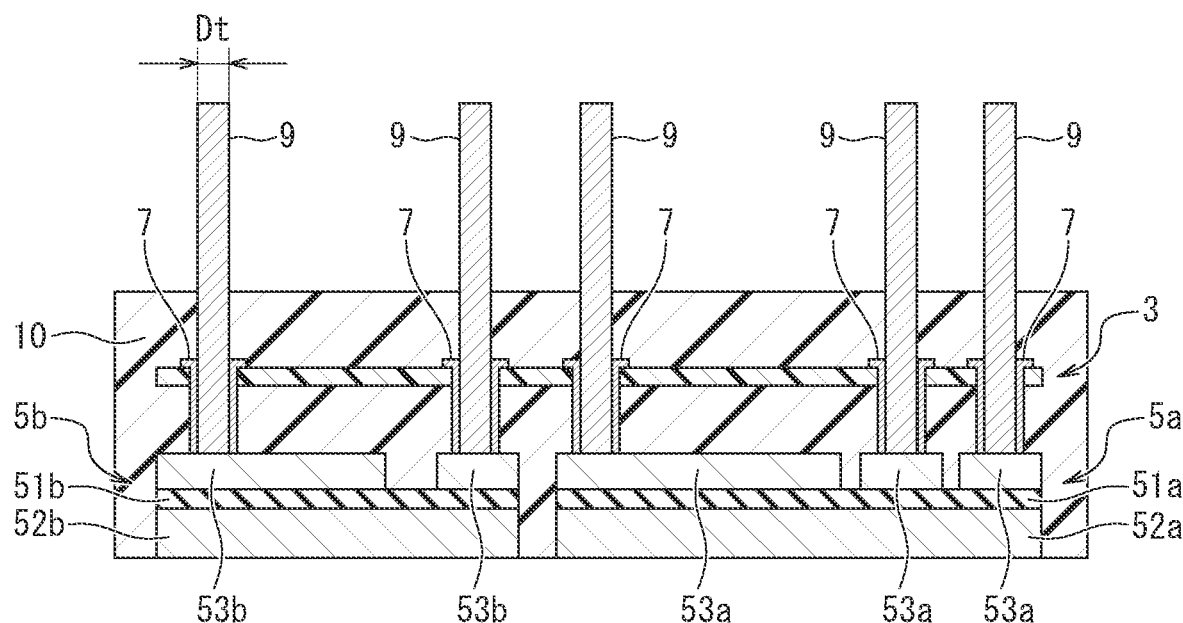
FIG. 3 is a schematic sectional view of the semiconductor device taken vertically along line B-B in FIG. 1.

As illustrated in FIG. 1, in a semiconductor device according to an embodiment of the present invention, a plurality of external connection terminals 9 are lined up in a longitudinal direction on an upper surface of a rectangular resin sealing portion 10. Additionally, in the semiconductor device according to the embodiment, an external circuit board is retained on an upper surface thereof, and a lower surface thereof is fixed to a heat sink, as illustrated in FIG. 3 and the like that will be described later. However, FIG. 1 illustrates the external connection terminals 9 that are connected to the external circuit board on the upper surface. In FIG. 1, the plurality of external connection terminals 9 are lined up at both ends in a transverse direction of the resin sealing portion 10. However, there is no limitation on how to line up and lay out the external connection terminals 9. At ends of the resin sealing portion 10 there may be provided screw holes for retaining the external circuit board and through holes for fixing the resin sealing portion 10 to the heat sink. The upper surface of the resin sealing portion 10 has a rectangular shape with long and short sides, and the shape of the entire resin sealing portion 10 may be substantially a rectangular parallelepiped.

Figure 2:
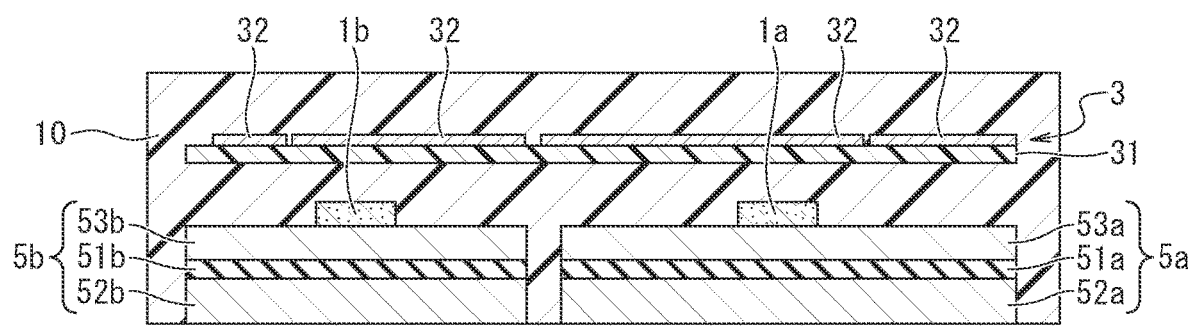
FIG. 2 is a schematic sectional view of the semiconductor device taken vertically along line A-A in FIG. 1.

As illustrated in FIG. 2, the semiconductor device having the top view illustrated in FIG. 1 includes a first insulated circuit board 5a, a second insulated circuit board 5b, a first semiconductor chip 1a, a second semiconductor chip 1b, and a wiring board 3, which are embedded in the resin sealing portion 10. The first insulated circuit board 5a includes an insulating plate 51a and conductor layers 52a and 53a. The second insulated circuit board 5b includes an insulating plate 51b and conductor layers 52b and 53b. The first insulated circuit board 5a and the second insulated circuit board 5b are direct copper bonding (DCB) boards, active metal brazed (AMB) boards, or resin insulation boards. The semiconductor device according to the embodiment uses the two first insulated circuit board 5a and second insulated circuit board 5b, but the invention is not limited thereto. One insulated circuit board or three or more insulated circuit boards may be used. It is preferable to use a plurality of insulated circuit boards small in area, because an increase in area of an insulated circuit board leads to a sharp increase in cost per unit area. The first semiconductor chip 1a is arranged on an upper surface of the conductor layer 53a of the first insulated circuit board 5a, and the second semiconductor chip 1b is arranged on an upper surface of the conductor layer 53b of the second insulated circuit board 5b. The conductor layers 53a and 53b, respectively, are provided with a wiring circuit pattern (unillustrated). The conductor layers 52a and 52b are provided such that lower surfaces thereof are exposed from a bottom surface of the resin sealing portion 10. The first semiconductor chip 1a and the second semiconductor chip 1b are electrically connected to wiring layers 32 of the wiring board 3, pin wires inserted in unillustrated through holes passing through the wiring board 3 and connected to the wiring layers 32, and any of the external connection terminals 9 by the conductor layers 52a, 52b, 53a, and 53b.

The first semiconductor chip 1a and the second semiconductor chip 1b include a power semiconductor element, such as a MOS field effect transistor (MOSFET), an insulated gate bipolar transistor (IGBT), or a Schottky barrier diode (SBD) in silicon carbide (SiC). The first semiconductor chip 1a and the second semiconductor chip 1b are not limited to SiC. As other hexagonal crystal semiconductor materials than SiC, for example, silicon (Si), gallium nitride (GaN), lonsdaleite (hexagonal diamond), or aluminum nitride (AlN), respectively, can be used. Additionally, it is also possible to use, as the power semiconductor element, a bipolar transistor (BPT), a static induction transistor (SIT), a static induction thyristor (SI thyristor), a gate turn-off thyristor (GTO thyristor), or the like.

Figure 4:
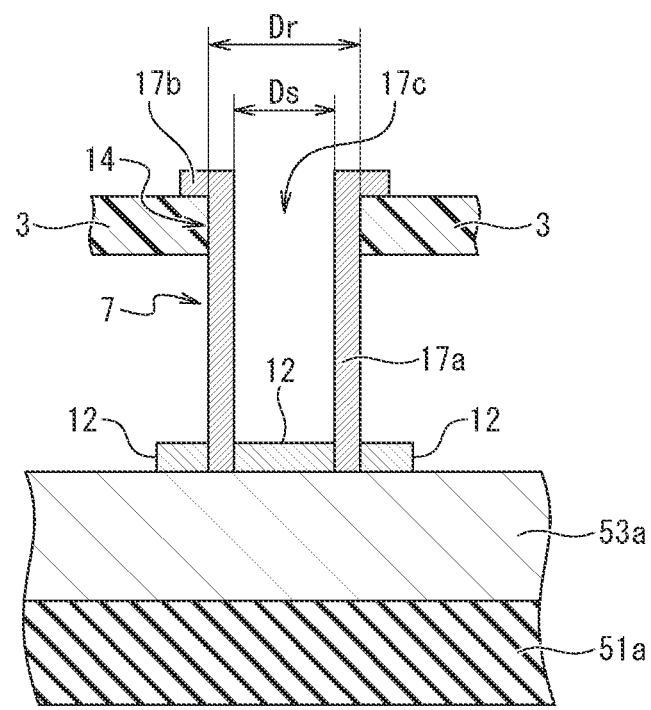
FIG. 4 is a schematic sectional view depicting one example of a hollow member for use in the semiconductor device according to the embodiment of the present invention.
Figure 5:
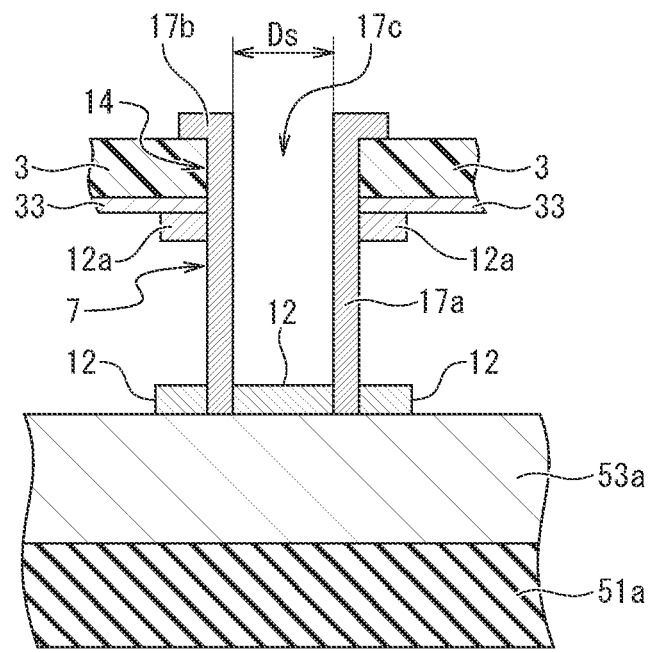
FIG. 5 is a schematic sectional view depicting another example of the hollow member for use in the semiconductor device according to the embodiment of the present invention.

As illustrated in FIG. 3, in the semiconductor device according to the embodiment, the external connection terminals 9 are inserted into hollow members 7 arranged in the wiring board 3. As illustrated in FIG. 4, each hollow member 7 includes a flanged portion 17b at one end of a cylindrical portion 17a of a main body including a cavity 17c. The cylindrical portion 17a of the hollow member 7 is press-fitted into each through hole 14 with a size Dr provided in the wiring board 3 such that the flanged portion 17b contacts with an upper surface of the wiring board 3. Another end of each cylindrical portion 17a press-fitted thereinto is inserted into or connected to, for example, a bonding material 12 arranged on the conductor layer 53a of the first insulated circuit board 5a. Then, the external connection terminal 9 with an outer diameter Dt is inserted into the cavity 17c with an inner diameter Ds, and metallurgically connected to the conductor layer 53a of the first insulated circuit board 5a by the bonding material 12. Note that, in FIG. 4, the hollow member 7 is press-fitted into the through hole 14 of the wiring board 3, but the invention is not limited thereto. For example, as illustrated in FIG. 5, after inserting the hollow member 7 into the through hole 14 of the wiring board 3, the cylindrical portion 17a of the hollow member 7 may be bonded to a wiring layer 33 provided on a back surface of the wiring board 3 by a bonding material 12a.

As the hollow member 7, copper (Cu) and alloys primarily containing Cu, such as phosphor bronze (Cu—Sn—P based) alloy, beryllium-copper (BeCu) alloy, and Corson copper (Cu—Ni—Si based) alloy can be used. A front surface of the hollow member 7 may be provided with a plating layer made of tin (Sn), nickel (Ni), silver (Ag), gold (Au), and the like. As the external connection terminals 9, Cu and alloys primarily containing Cu can be employed. Particularly, when used in large current, oxygen-free copper high in conductivity is preferably used as the external connection terminals 9. Additionally, as a press-fit terminal 9a illustrated in FIG. 7, springy alloys primarily containing Cu, such as a Cu—Sn—P based alloy, a BeCu alloy, and Cu—Ni—Si based alloy are preferable. A plating layer made of material such as Sn, Ni, Ag, and Au may be provided on a surface of each external connection terminal 9 or the press-fit terminal 9a. In addition, as the bonding material 12, a solder, a sintered metal using Ag nanoparticles with nanometer size, or the like is used.

As the wiring board 3, a printed circuit board (PCB) or the like is used. On the through holes 14 of the wiring board 3, an Au or Cu plating layer plated on an Ni base film is formed. When requiring an electrical connection to the wiring layer 32, 33 of the wiring board 3, the plating layer made of Sn and the like formed on the front surface of the hollow member 7 is heated and melted to allow a metallurgical connection to the wiring layer 32 on the upper surface of the wiring board 3 or the wiring layer 33 on the lower surface thereof. Alternatively, a metallurgical connection to the wiring layer 32 on the upper surface or the wiring layer 33 on the lower surface may be made via the plating layer formed on the through holes 14. Additionally, when requiring no electrical connection to the wiring layer 32, 33 of the wiring board 3, the hollow member 7 may be directly contacted with a resin plate 31 in the through holes 14 of the wiring board 3.

Figure 6:
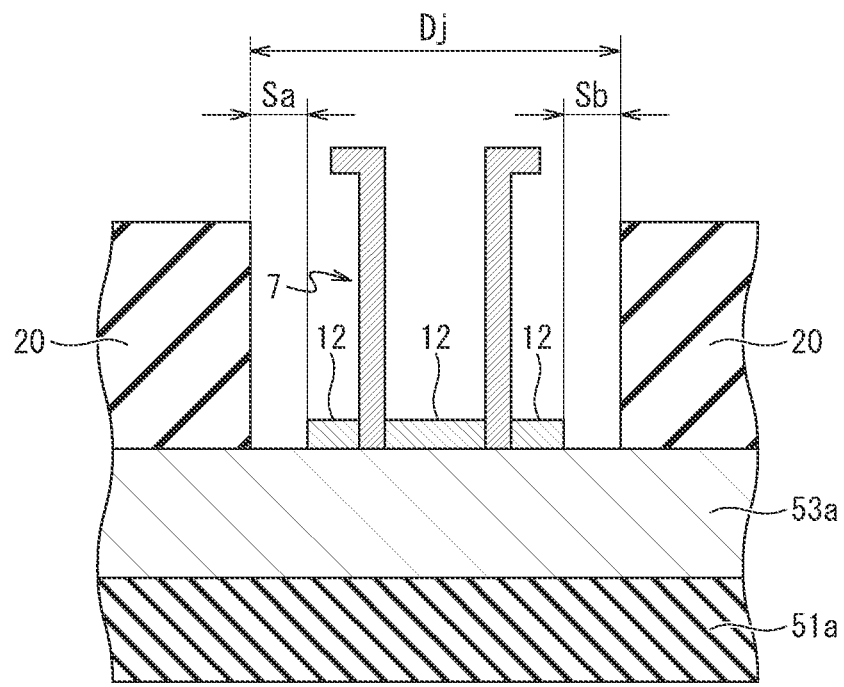
FIG. 6 is a schematic sectional view depicting one example of positioning of a conventional hollow member.
Figure 7:
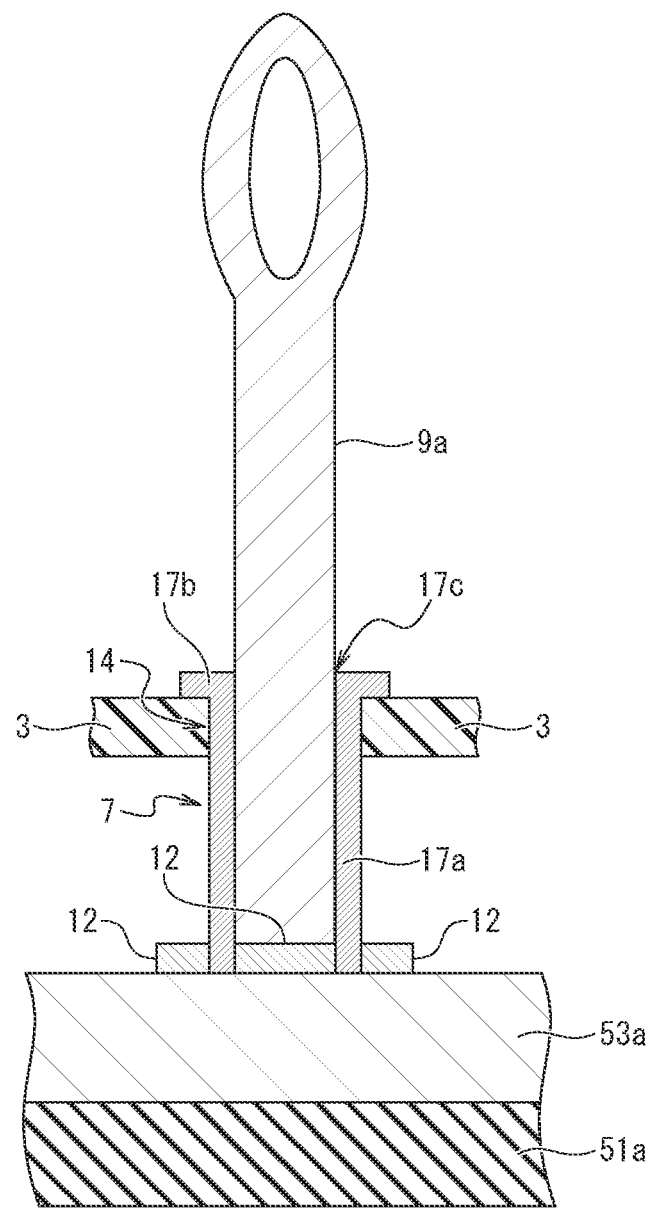
FIG. 7 is a schematic sectional view depicting one example of connection of a press-fit terminal to the hollow member for use in the semiconductor device according to the embodiment of the present invention.

FIG. 6 is a schematic sectional view depicting a method for positioning the hollow member 7 by using a conventional positioning jig 20. As illustrated in FIG. 6, the position of the hollow member 7 that is mounted on the conductor layer 53a is determined in accordance with an inner diameter size Dj of a grooved portion 15 of the jig 20. When dimensional tolerance between the jig 20 and the hollow member 7 is small, solder clogging between the jig 20 and the hollow member 7 may inhibit pull-out of the jig 20. Additionally, removal of the jig 20 may damage the hollow member 7. Due to that, a tolerance of about from 100 µm to 200 µm is secured to enable the jig 20 to be easily pulled out. As a result, a positional deviation Sa, Sb of the hollow member 7 can be about from 100 µm to 200 µm, as illustrated in FIG. 6. Particularly, as illustrated in FIG. 7, when the press-fit terminal 9a is used as an external connection terminal to connect to an external wiring board, contact resistance is increased, leading to a concern about occurrences of contact failure and loss increase.

In the embodiment, the tolerance of the through holes 14 of the wiring board 3 is the positional tolerance of the hollow members 7, as illustrated in FIG. 4. Accordingly, the positional tolerance of the hollow members 7 can be set to less than 100 µm, for example, about 50 µm or less, thus enabling reduction in the positional deviation of the hollow members 7. When connecting to the external wiring board by using the press-fit terminal 9a illustrated in FIG. 7, increase in contact resistance is suppressed, which can prevent contact failure and loss increase, so that reliability can be secured.

Figure 8:
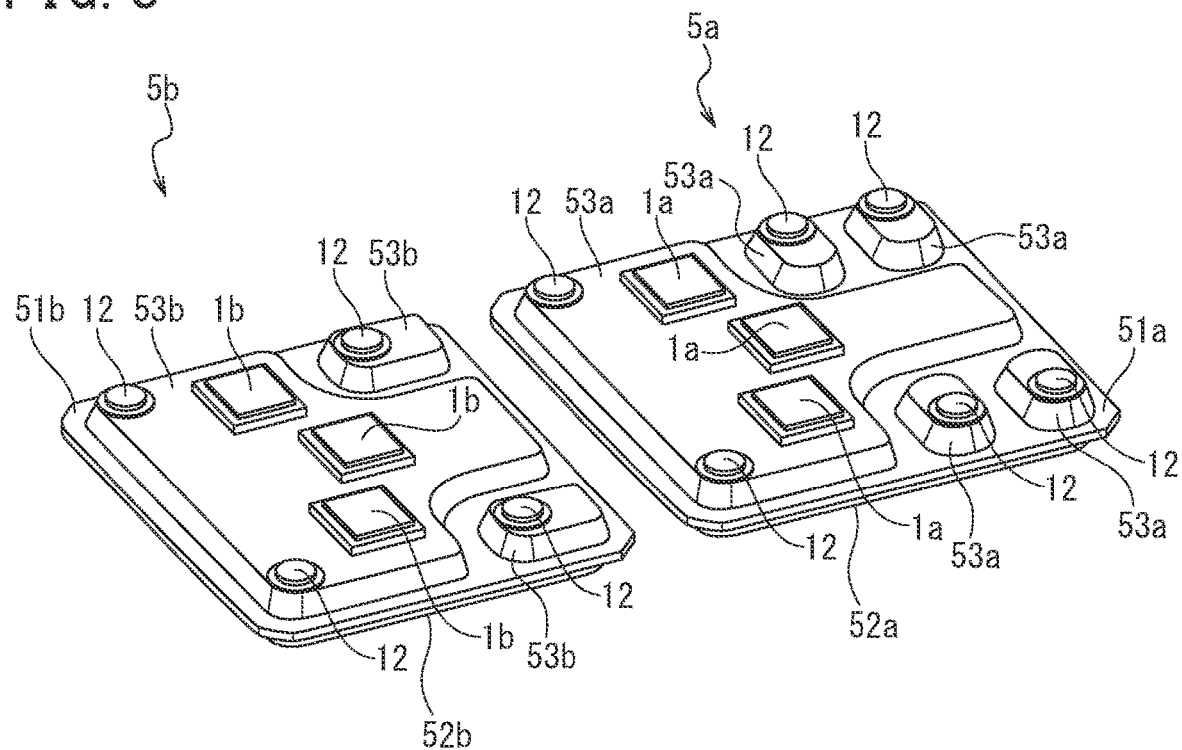
FIG. 8 is a perspective view depicting one example of a method for manufacturing the semiconductor device according to the embodiment of the present invention.

Next, a description will be given of a method for manufacturing the semiconductor device according to the embodiment with reference to FIG. 4 and FIGS. 8 to 11. First, as illustrated in FIG. 8, there are prepared the first insulated circuit board 5a including the conductor layer 52a on a lower surface of the insulating plate 51a and a plurality of the conductor layers 53a on an upper surface thereof and the second insulated circuit board 5b including the conductor layer 52b on a lower surface of the insulating plate 51b and a plurality of conductor layers 53b on an upper surface thereof. For example, a plurality of the first semiconductor chips 1a are bonded to the conductor layers 53a of the first insulated circuit board 5a by a bonding material such as solder or a sintered metal. Similarly, for example, a plurality of the second semiconductor chips 1b are bonded to the conductor layers 53b of the second insulated circuit board 5b by a bonding material such as solder or a sintered metal. Furthermore, the bonding material 12 such as solder or a sintered metal is arranged at each of a plurality of predetermined positions on the conductor layers 53a of the first insulated circuit board 5a and at each of a plurality of predetermined positions on the conductor layers 53b of the second insulated circuit board 5b.

Figure 9:
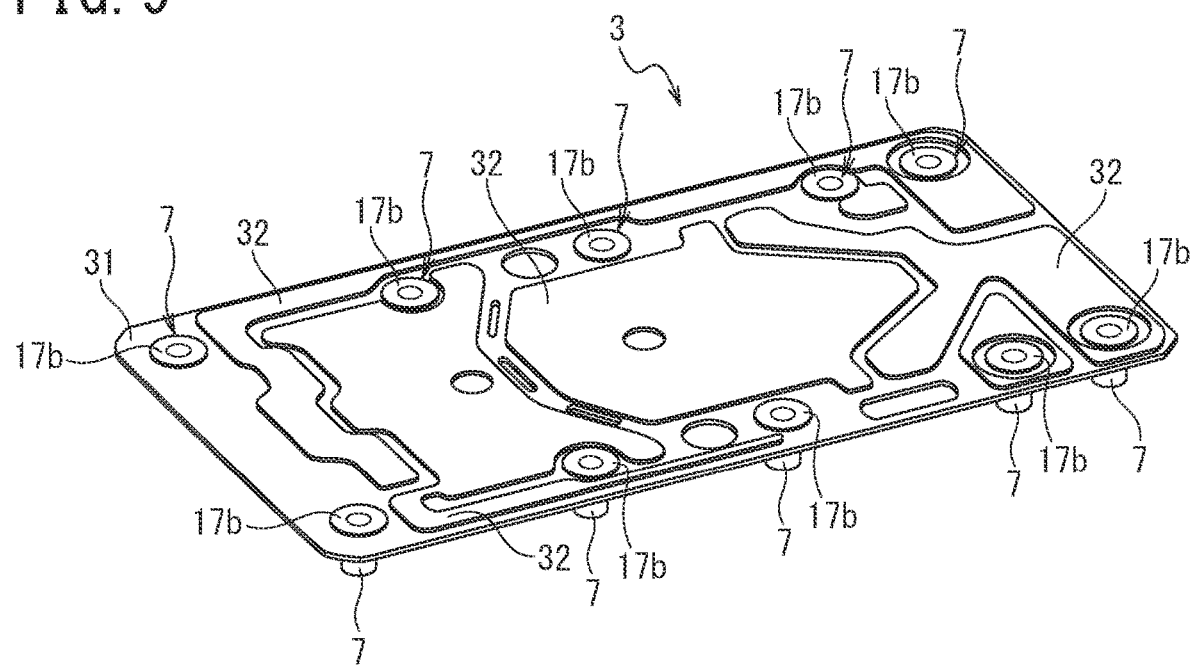
FIG. 9 is a perspective view following FIG. 8 and depicting one example of the method for manufacturing the semiconductor device according to the embodiment of the present invention.

On the wiring board 3, each through hole 14 illustrated in FIG. 4 is formed in such a manner as to correspond to each position where each of the plurality of bonding materials 12 is arranged when the through holes 14 are arranged facing the conductor layers 53a of the first insulated circuit board 5a and the conductor layers 53b of the second insulated circuit board 5b. Positional tolerances of the plurality of through holes 14 of the wiring board 3 are each less than 100 µm, for example, about 50 µm. A plurality of the hollow members 7 are prepared that each includes the cylindrical portion 17a having the cavity 17c and the flanged portion 17b at the one end of the cylindrical portion 17a, as illustrated in FIG. 4. As illustrated in FIG. 9, the cylindrical portions 17a of the hollow members 7 are respectively press-fitted into the plurality of through holes 14 such that the flanged portions 17b illustrated in FIGS. 5, 7, and the like contact with the upper surface of the wiring board 3.

Figure 10:
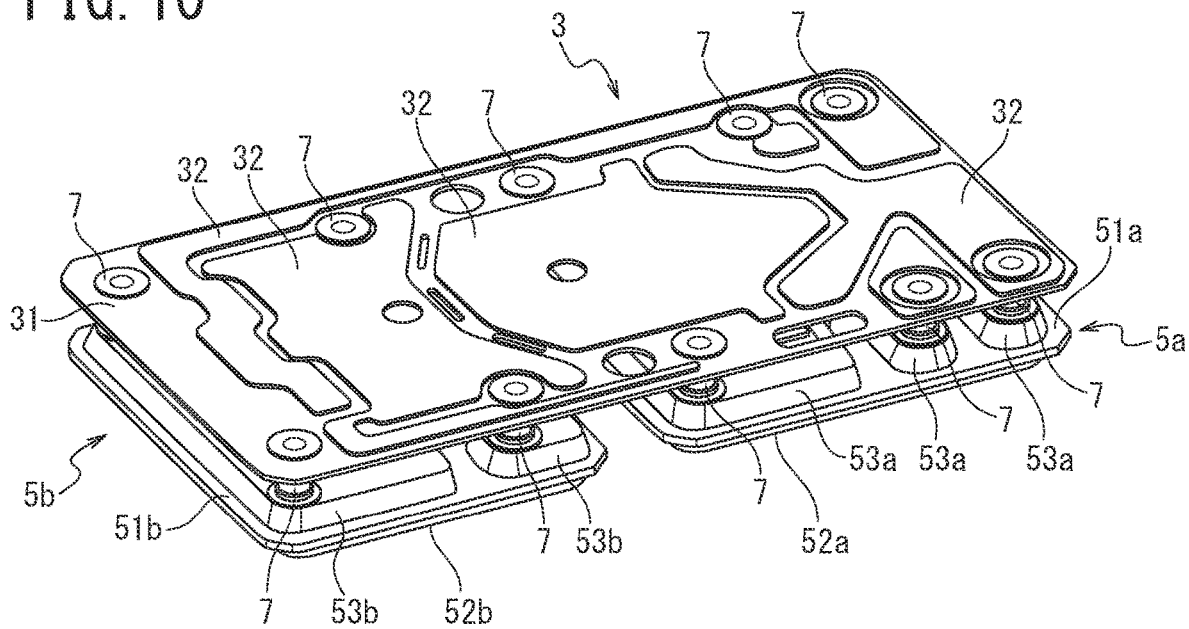
FIG. 10 is a perspective view following FIG. 9 and depicting one example of the method for manufacturing the semiconductor device according to the embodiment of the present invention.

As illustrated in FIG. 10, the wiring board 3 and the first and second insulated circuit boards 5a and 5b are arranged such that the other ends of the cylindrical portions 17a of the hollow members 7 press-fitted into the through holes 14 of the wiring board 3 face the conductor layers 53a and 53b of the first and second insulated circuit boards 5a and 5b. The other ends of the cylindrical portions 17a of the hollow members 7 are bonded to each of the conductor layers 53a of the first insulated circuit board 5a and each of the conductor layers 53b of the second insulated circuit board 5b by the plurality of bonding materials 12. For example, if solder is used as the plurality of bonding materials 12, the solder is melted at a temperature of about from 150° C. to 240° C. to bond the hollow members 7 by reflow technology. Alternatively, if a sintered metal is used as the plurality of bonding materials 12, the metal is sintered at a temperature of about from 200° C. to 300° C. to bond the hollow members 7.

Figure 11:
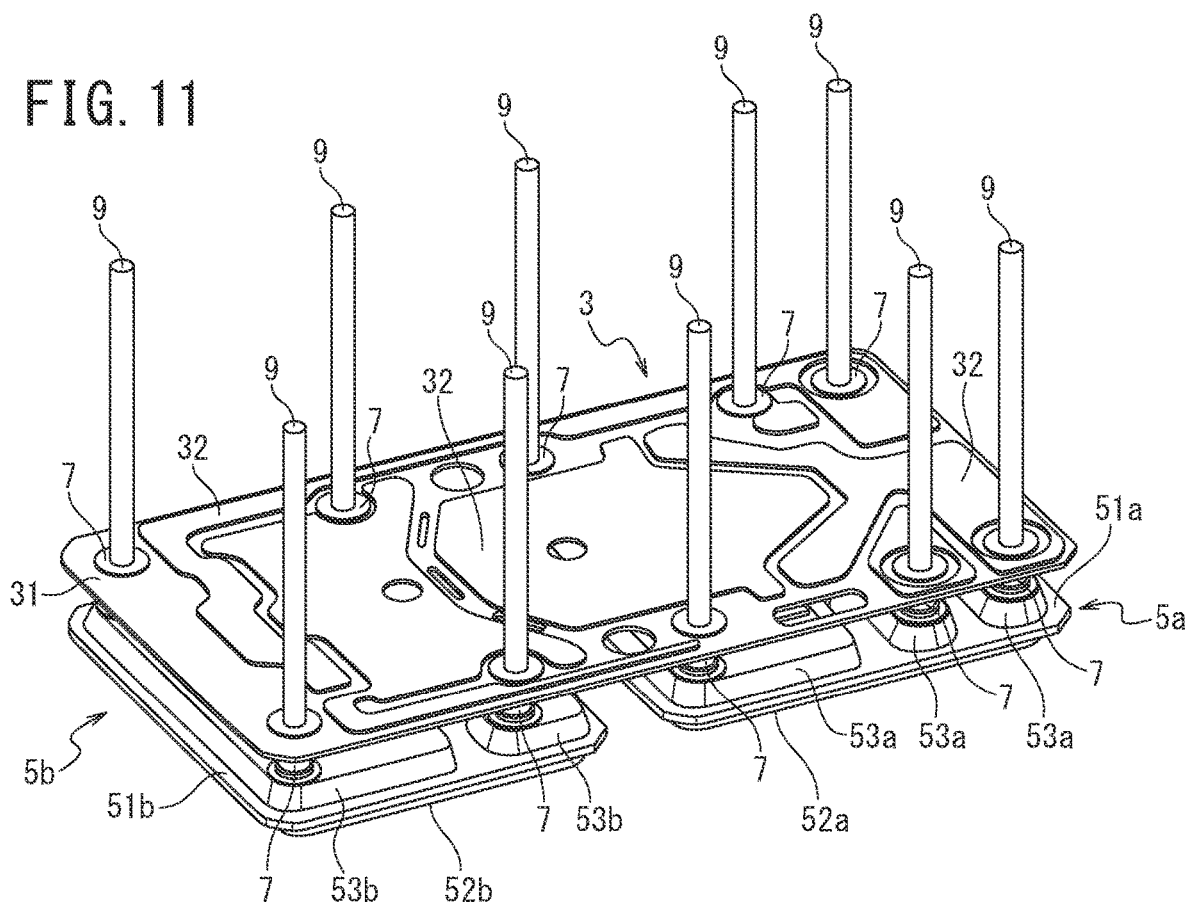
FIG. 11 is a perspective view following FIG. 10 and depicting one example of the method for manufacturing the semiconductor device according to the embodiment of the present invention.

As illustrated in FIG. 11, the external connection terminals 9 are inserted into the cavities 17c of the hollow members 7 illustrated in FIG. 4. Then, if the plurality of bonding materials 12 are solder, the solder is melted at a temperature of about from 150° C. to 240° C. to metallurgically connect the external connection terminals 9 to the conductor layers 53a and 53b by reflow technology. Alternatively, if the plurality of bonding materials 12 is a sintered metal, the metal is sintered at a temperature of about from 200° C. to 300° C. to metallurgically connect the external connection terminals 9 to the conductor layers 53a and 53b.

Figure 12:
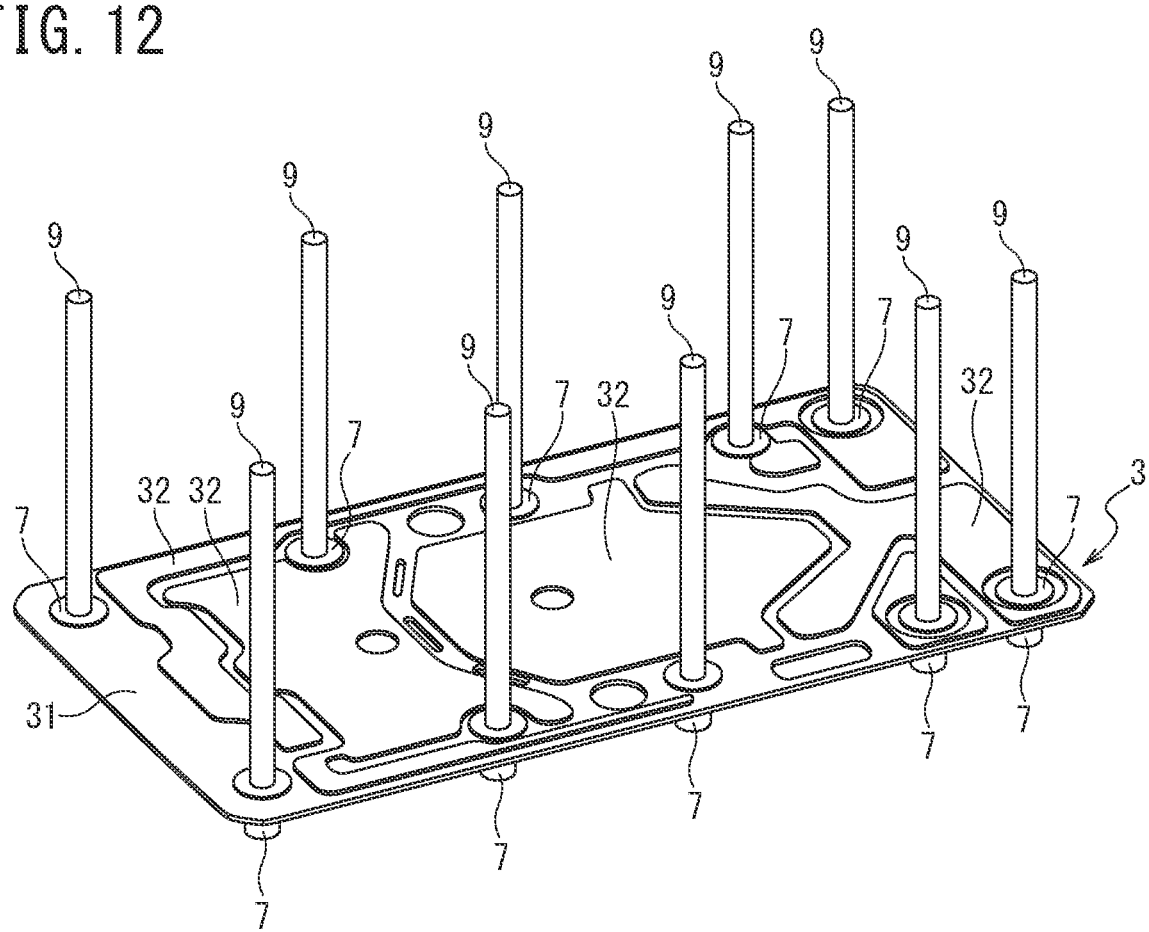
FIG. 12 is a perspective view depicting another example of the method for manufacturing the semiconductor device according to the embodiment of the present invention.

In the above description, the external connection terminals 9 are inserted into the cavities 17c of the hollow members 7 after arranging the wiring board 3 and the first and second insulated circuit boards 5a and 5b in such a manner as to face each other, as illustrated in FIG. 10. However, as illustrated in FIG. 12, after press-fitting the hollow members 7 into the through holes 14 of the wiring board 3, as illustrated in FIG. 9, the external connection terminals 9 may be inserted into the cavities 17c of the hollow members 7. In the state where the external connection terminals 9 are inserted in the cavities 17c of the hollow members 7, the hollow members 7 are bonded to each of the conductor layers 53a of the first insulated circuit board 5a and the conductor layers 53b of the second insulated circuit board 5b by the plurality of bonding materials 12, as illustrated in FIG. 11.

In the embodiment, the tolerance of the through holes 14 of the wiring board 3 is the positional tolerance of the hollow members 7, as illustrated in FIG. 4. Accordingly, the positional tolerance of the hollow members 7 can be set to less than 100 µm, for example, about 50 µm or less, thus enabling reduction in the positional deviation of the hollow members 7. Additionally, since the hollow members 7 are retained by the through holes 14 of the wiring board 3, and the cavities 17c serve as heat-releasing pathways during heating of the plurality of bonding materials 12, scattering of the plurality of bonding materials 12 can be prevented. As a result, increase in the contact resistance of the external connection terminals 9 is suppressed, which can prevent contact failure and loss increase, so that reliability can be secured.

Other Embodiments

While the present invention has been described by one embodiment as above, it should be understood that the description and drawings forming a part of this disclosure do not limit the invention. Understanding the gist of the disclosure of the above embodiment would make it apparent to those skilled in the art that various alternative embodiments, Examples, and operational technologies can be included in the present invention. Additionally, it is obvious that the invention includes various embodiments and the like not described herein, such as structures formed by optionally applying the respective structures described in the above embodiment and respective modifications. Accordingly, the technological scope of the invention is defined only by the matters specifying the invention according to the claims, which are reasonable from the above exemplary description.

REFERENCE SIGNS LIST

1a: First semiconductor chip
1b: Second semiconductor chip
3: Wiring board
5a: First insulated circuit board
5b: Second insulated circuit board
7: Hollow member
9: External connection terminal
9a: Press-fit terminal 10: Resin sealing portion
12: Bonding material
14: Through hole
15: Grooved portion
17a: Cylindrical portion
17b: Flanged portion
17c: Cavity
31: Resin plate
32, 33: Wiring layer
51a, 51b: Insulating plate
52a, 52b, 53a, 53b: Conductor layer

The invention claimed is:

1. A semiconductor device comprising: an insulated circuit board including conductor layers arranged away from each other and a plurality of bonding materials each provided on the conductor layers; a wiring board including an opposing surface facing the conductor layers and including a plurality of through holes respectively corresponding to positions of the plurality of bonding materials; a plurality of hollow members, each including a cylindrical portion and a flanged portion provided at one end of the cylindrical portion and having a cavity in common with the cylindrical portion, the cylindrical portion each being press-fitted into a corresponding one of the plurality of through holes of the wiring board, and other end of the cylindrical portion being bonded to a corresponding one of the conductor layers by the plurality of bonding materials; and a plurality of external connection terminals each inserted into a corresponding one of the cavities of the plurality of hollow members and bonded to the conductor layers, wherein the cylindrical portions are each inserted into a corresponding one of the plurality of through holes such that the flanged portions each contact an upper surface of the wiring board which is opposite to the opposing surface of the wiring board, wherein the insulated circuit board includes a plurality of insulated circuit boards, the conductor layers being provided on each of the plurality of insulated circuit boards, and the plurality of hollow members being bonded to each of the conductor layers.

2. The semiconductor device according to claim 1, wherein the bonding materials are a solder material.

3. The semiconductor device according to claim 1, wherein the bonding materials are a sintered metal material.

4. The semiconductor device according to claim 1, wherein the bonding materials are a solder material.

5. The semiconductor device according to claim 1, wherein the bonding materials are a sintered metal material.

6. The semiconductor device according to claim 1, wherein a tolerance between the hollow members and the through holes of the wiring board is less than 100 μm.

7. A method for manufacturing a semiconductor device comprising: preparing an insulated circuit board including conductor layers arranged away from each other and a plurality of bonding materials each provided on the conductor layers; preparing a wiring board on which a plurality of through holes are formed to correspond to positions where the plurality of bonding materials are arranged; causing the wiring board to face the insulated circuit board such that an opposing surface of the wiring board is oriented toward the bonding materials; preparing a plurality of hollow members each including a cylindrical portion and a flanged portion provided at one end of the cylindrical portion and having a cavity in common with the cylindrical portion, and press-fitting each of the cylindrical portions into each of the plurality of through holes such that the flanged portions each contact with an upper surface opposed to the opposing surface of the wiring board; bonding each of other ends opposed to the one ends of the cylindrical portions passing through the plurality of through holes and protruding from the opposing surface to the conductor layers by the plurality of bonding materials; and inserting an external connection terminal into the cavity of each of the plurality of hollow members, wherein the insulated circuit board includes a plurality of insulated circuit boards, the conductor layers being provided on each of the plurality of insulated circuit boards, and the plurality of hollow members being bonded to each of the conductor layers.

8. The method for manufacturing a semiconductor device according to claim 7, wherein the external connection terminals are inserted into the cavities after bonding the other ends of the cylindrical portions to the conductor layers.

9. The method for manufacturing a semiconductor device according to claim 7, wherein the external connection terminals are inserted into the cavities before bonding the other ends of the cylindrical portions to the conductor layers.

10. The method for manufacturing a semiconductor device according to claim 7, wherein the bonding materials are a solder material.

11. The method for manufacturing a semiconductor device according to claim 7, wherein the bonding materials are a sintered metal material.

12. The method for manufacturing a semiconductor device according to claim 7, wherein the bonding materials are a solder material.

13. The method for manufacturing a semiconductor device according to claim 7, wherein the bonding materials are a sintered metal material.

14. The method for manufacturing a semiconductor device according to claim 8, wherein the bonding materials are a solder material.

15. The method for manufacturing a semiconductor device according to claim 8, wherein the bonding materials are a sintered metal material.

16. The method for manufacturing a semiconductor device according to claim 9, wherein the bonding materials are a solder material.

17. The method for manufacturing a semiconductor device according to claim 9, wherein the bonding materials are a sintered metal material.

* * * * *

UNITED STATES PATENT AND TRADEMARK OFFICE
CERTIFICATE OF CORRECTION

PATENT NO. : 11,171,078 B2
APPLICATION NO. : 16/801996
DATED : November 9, 2021
INVENTOR(S) : Hinata et al.

Page 1 of 1

It is certified that error appears in the above-identified patent and that said Letters Patent is hereby corrected as shown below:

In the Claims

Column 10, Line 22:
In Claim 7, delete "lavers." and insert --layers--, therefor.

Signed and Sealed this
Twenty-eighth Day of December, 2021

Drew Hirshfeld
*Performing the Functions and Duties of the*
*Under Secretary of Commerce for Intellectual Property and*
*Director of the United States Patent and Trademark Office*